US011100973B2

(12) United States Patent
Morgan

(10) Patent No.: US 11,100,973 B2
(45) Date of Patent: Aug. 24, 2021

(54) APPARATUSES AND METHODS FOR MEMORY DEVICES WITH CONTINUOUS SELF-REFRESH TIMER

(71) Applicant: MICRON TECHNOLOGY, INC., Boise, ID (US)

(72) Inventor: Donald M. Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/444,916

(22) Filed: Jun. 18, 2019

(65) Prior Publication Data

US 2019/0304534 A1 Oct. 3, 2019

Related U.S. Application Data

(62) Division of application No. 15/245,067, filed on Aug. 23, 2016, now Pat. No. 10,354,714.

(51) Int. Cl.
*G11C 11/406* (2006.01)
*G11C 11/4076* (2006.01)
*G11C 7/04* (2006.01)

(52) U.S. Cl.
CPC .......... *G11C 11/40615* (2013.01); *G11C 7/04* (2013.01); *G11C 11/4076* (2013.01); *G11C 11/40626* (2013.01)

(58) Field of Classification Search
CPC ............... G11C 11/40615; G11C 7/04; G11C 11/40626

(Continued)

(56) References Cited

U.S. PATENT DOCUMENTS 4,625,301 A 11/1986 Berger
6,449,204 B1* 9/2002 Arimoto ............. G11C 7/1045
365/189.09

(Continued)

FOREIGN PATENT DOCUMENTS

WO 2018038850 A1 3/2018

OTHER PUBLICATIONS

English translation of Notice of Preliminary Rejection for KR Application No. 10-2019-7008111, dated May 18, 2020.

(Continued)

*Primary Examiner* — Anthan Tran
(74) *Attorney, Agent, or Firm* — Dorsey & Whitney LLP

(57) ABSTRACT

Systems and apparatuses for memory devices utilizing a continuous self-refresh timer are provided. An example apparatus includes a self-refresh timer configured to generate a signal periodically, wherein a period of the signal is based on a self-refresh refresh time interval, wherein the self-refresh refresh time interval is dependent on temperature information. The apparatus may further include a memory bank comprising at least a first subarray and in communication with a first subarray refresh circuit, which may include a first refresh status counter. The first refresh status counter may be in communication with the self-refresh timer and configured to receive the signal from the self-refresh timer, change a count value of the first refresh status counter in a first direction each time the signal is received, and change the count value of the first refresh status counter in a second direction each time the first subarray is refreshed.

7 Claims, 9 Drawing Sheets

(58) Field of Classification Search
USPC .......................................................... 365/149
See application file for complete search history.

(56) References Cited

U.S. PATENT DOCUMENTS

| | | | |
|---|---|---|---|
| 8,605,489 | B2 | 12/2013 | Reohr et al. |
| 9,001,608 | B1 | 4/2015 | Chishti et al. |
| 2006/0114734 | A1 | 6/2006 | Cruz et al. |
| 2008/0253212 | A1 | 10/2008 | Iida et al. |
| 2008/0270683 | A1 | 10/2008 | Barth et al. |
| 2010/0195412 | A1* | 8/2010 | Furutani .................. G11C 8/18 365/189.05 |
| 2011/0170366 | A1 | 7/2011 | Chen |
| 2011/0299352 | A1 | 12/2011 | Fujishiro et al. |
| 2016/0163377 | A1* | 6/2016 | Oh ..................... G11C 11/40615 365/222 |
| 2018/0061483 | A1 | 3/2018 | Morgan |
| 2019/0304534 | A1 | 10/2019 | Morgan |

OTHER PUBLICATIONS

Extended European Search Report for Application No. 17844091.3, dated Mar. 12, 2020.
English Translation of First Office Action dated Jul. 20, 2018 for Taiwanese Application No. 106127595.
International Preliminary Report on Patentability dated Feb. 26, 2019 for PCT Application No. PCT/US2017/043714, 12 pages.
International Search Report and Written Opinion dated Nov. 7, 2017 for PCT Application No. PCT/US2017/043714.

\* cited by examiner

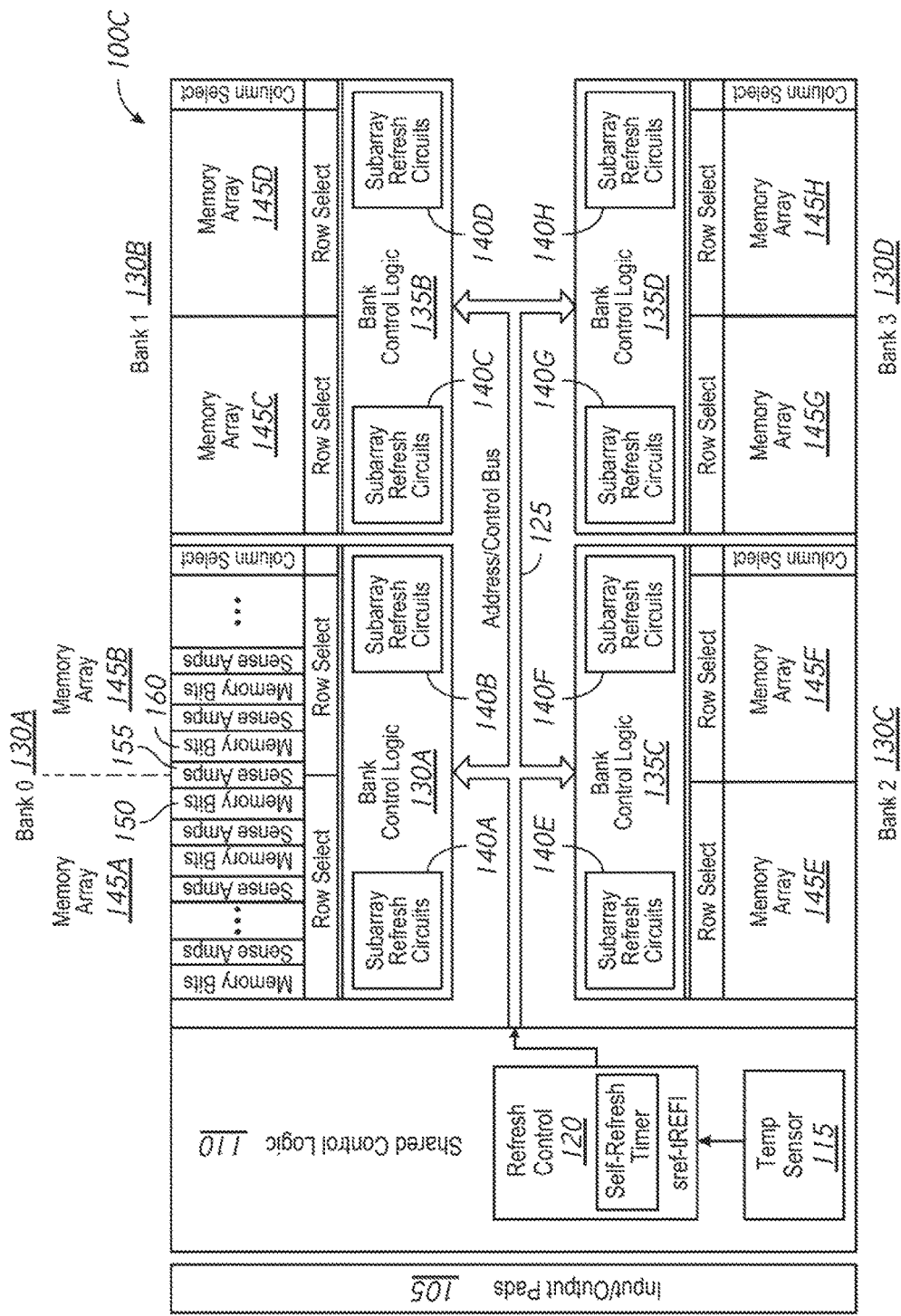

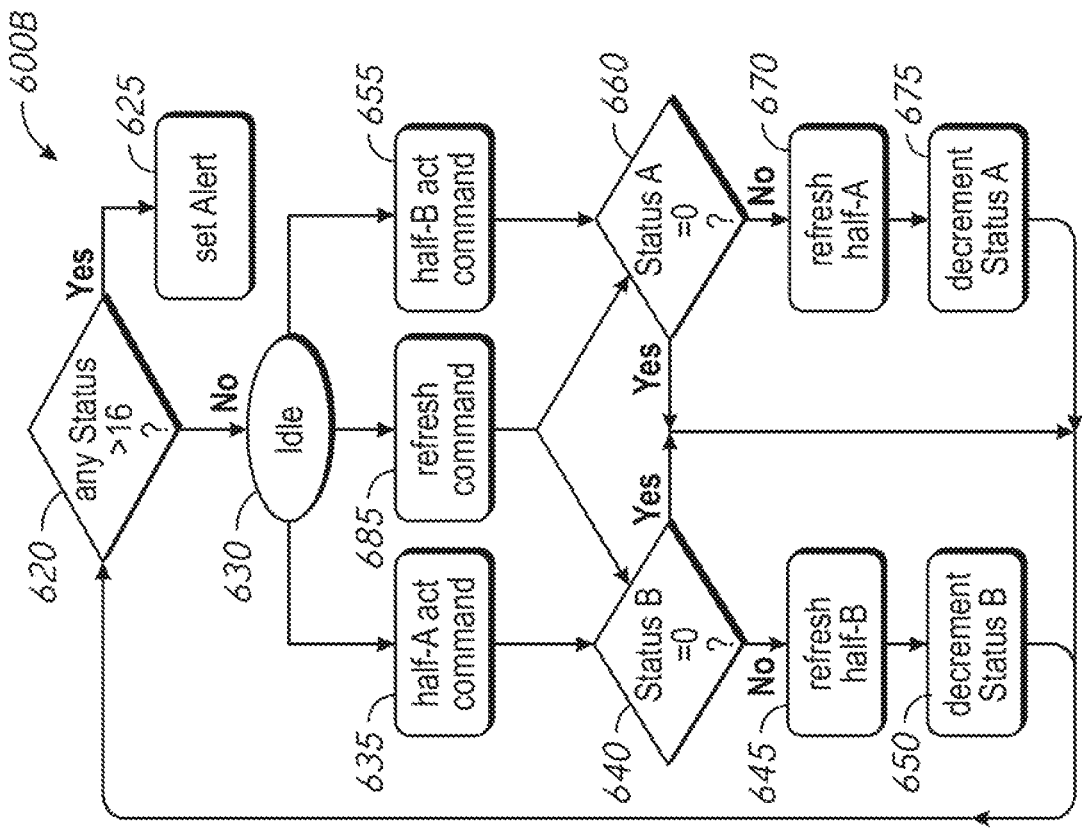
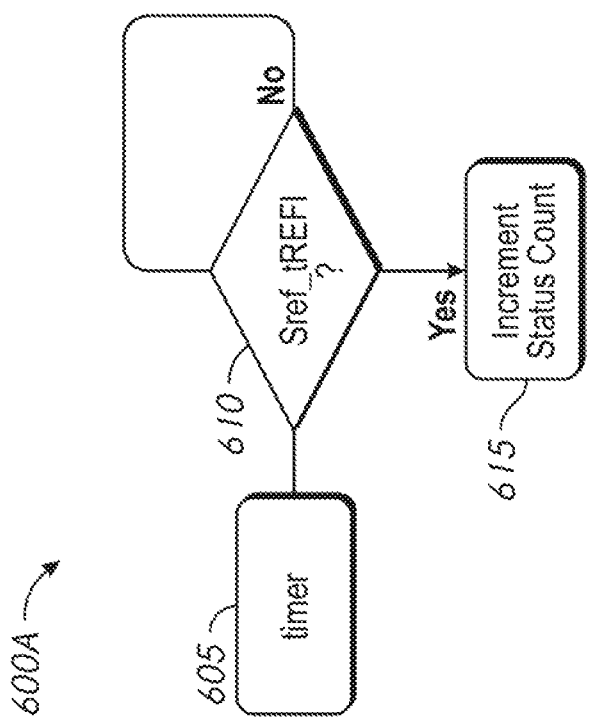
FIG. 6B
FIG. 6A

APPARATUSES AND METHODS FOR MEMORY DEVICES WITH CONTINUOUS SELF-REFRESH TIMER

CROSS-REFERENCE TO RELATED APPLICATION

This application is a divisional of U.S. patent application Ser. No. 15/245,067, filed Aug. 23, 2016. This application is incorporated by reference herein in its entirety and for all purposes.

BACKGROUND

The basic operations for dynamic random access memory (DRAM) include reading data, writing data, and refreshing of stored data. Modern DRAM cells must be refreshed periodically to prevent the loss or corruption of data stored by the memory cells, typically through leakage in the memory cells. Conventionally, periodic refreshes are performed on an entire rank, or alternatively on an entire bank in per-bank refresh operations. Thus, while being refreshed, either the entire rank, or the entire bank, is prevented from handling requests.

Self-refresh is a technique for DRAM refresh without requiring a memory controller to provide refresh commands. Typically, while in self-refresh mode, a self-refresh timer determines when a refresh is needed based on temperature information. When self-refresh mode is entered, the self-refresh timer starts from 0, and when self-refresh mode is exited, the self-refresh timer is reset. Because the status of refreshes is unknown when self-refresh mode is entered, a refresh is triggered upon each entry into self-refresh mode. This can lead to excess power consumption by unnecessary refresh operations when self-refresh mode is entered and exited in quick succession.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 1C is a schematic block diagram of an alternative architecture for a memory device configured for subarray parallel refresh, in accordance with various embodiments

FIG. 6A is a flow diagram of a process for refresh status counter operation based on the self-refresh refresh time interval, in accordance with various embodiments.

FIG. 6B is a flow diagram for subarray parallel refresh of a memory device, in accordance with various embodiments.

DETAILED DESCRIPTION

The following detailed description illustrates a few exemplary embodiments in further detail to enable one of skill in the art to practice such embodiments. The described examples are provided for illustrative purposes and are not intended to limit the scope of the invention. In the following description, for the purposes of explanation, numerous specific details are set forth in order to provide a thorough understanding of the described embodiments. It will be apparent to one skilled in the art, however, that other embodiments of the present invention may be practiced without some of these specific details.

Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1A:
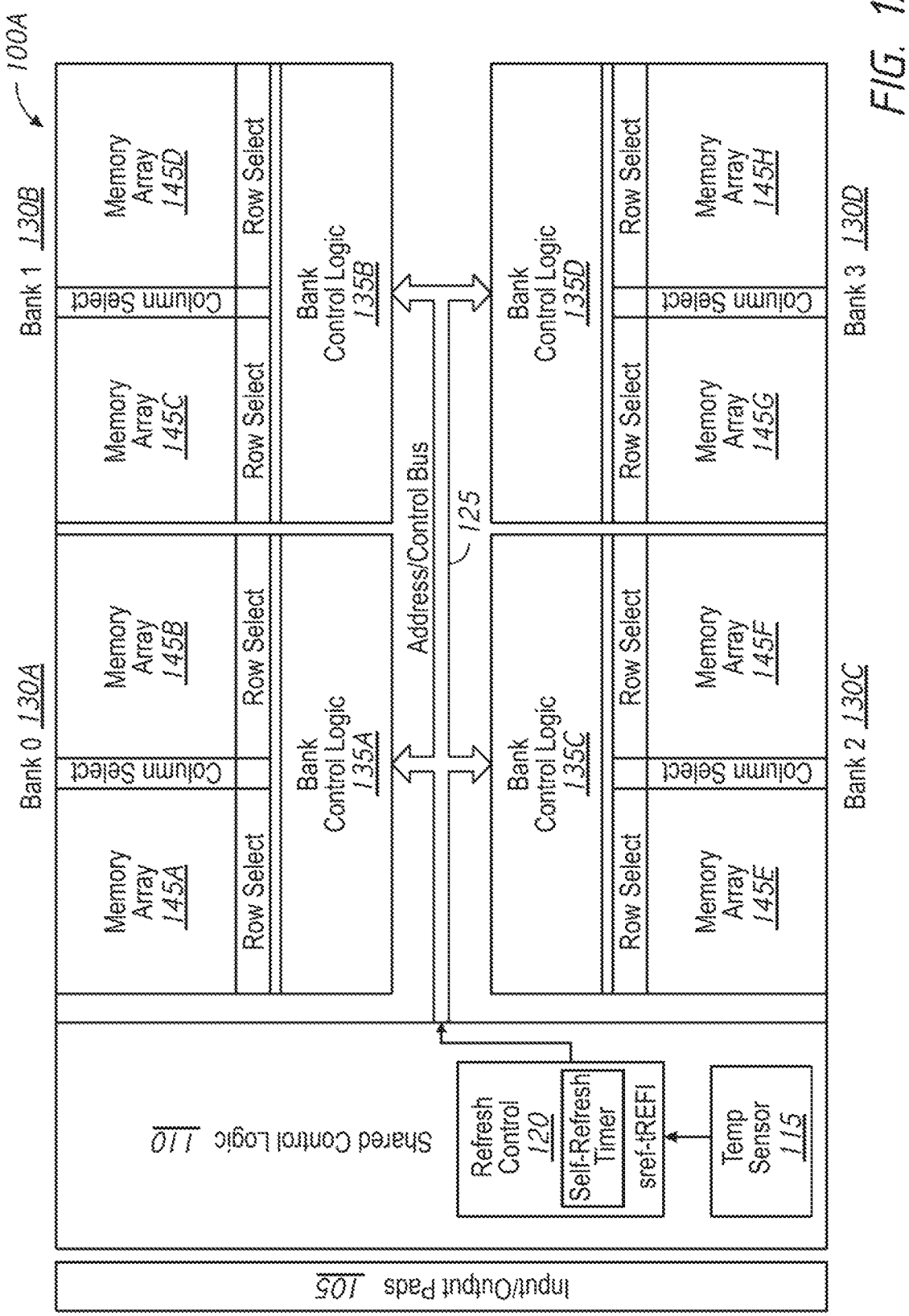
FIG. 1A is a schematic block diagram of a memory device configured for power saving self-refresh, in accordance with various embodiments.
Figure 1B:
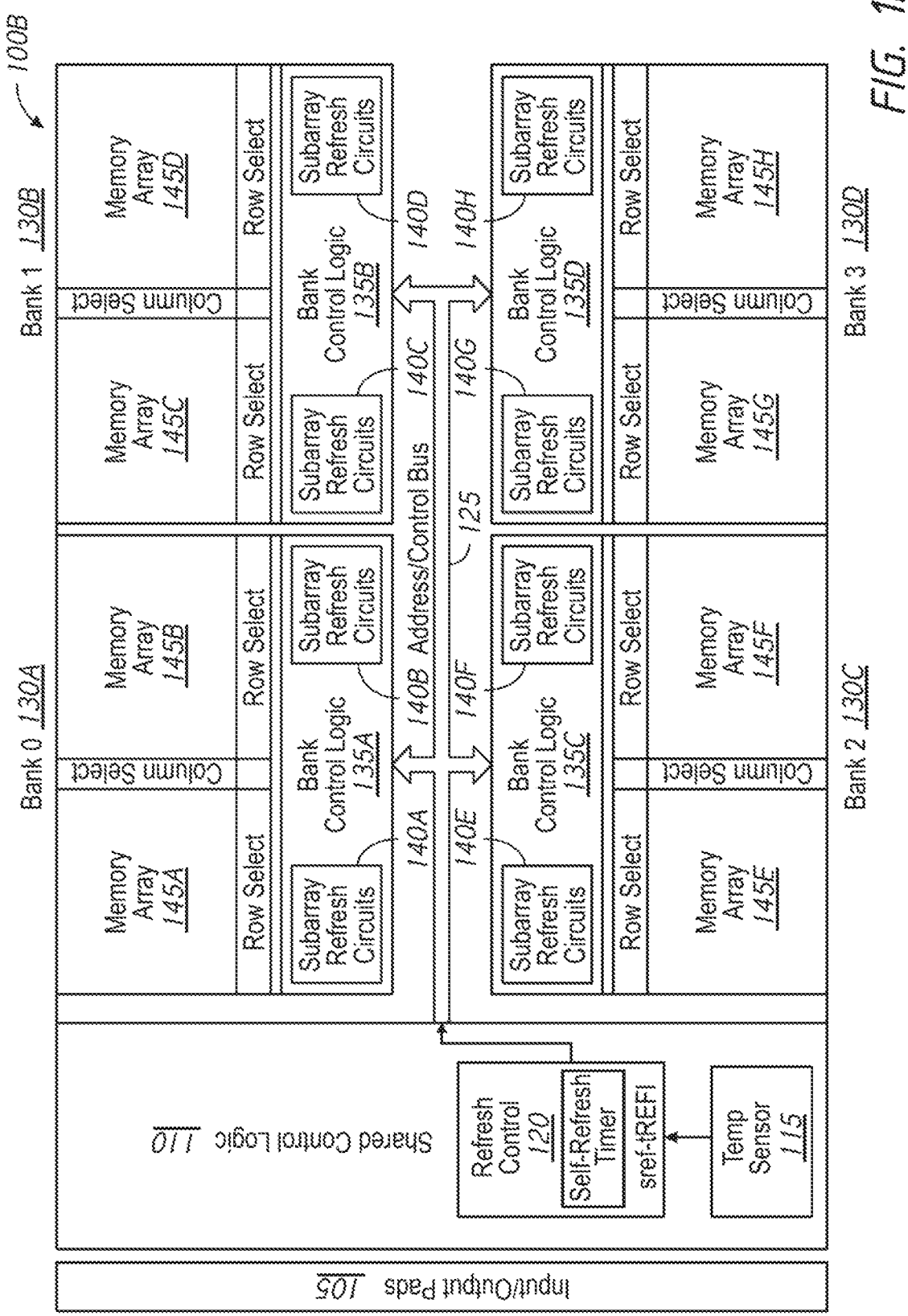
FIG. 1B is a schematic block diagram of a memory device further configured for subarray parallel refresh, in accordance with various embodiments.

FIGS. 1A, 1B, and 1C illustrate a schematic block diagram of memory devices 100A, 100B, 100C according to various embodiments. Generally speaking, FIG. 1A illustrates embodiments of the memory device 100A that provide a power saving self-refresh (PSSR) operability through the use of a continuous self-refresh timer. Power saving self-refresh utilizes a continuous self-refresh timer to reduce excess power consumption caused by unnecessary refresh operations when quickly entering and exiting self-refresh mode repeatedly. FIG. 1B illustrates embodiments of the memory device 100B provide a way to implement subarray parallel refresh operations through the use of a continuous self-refresh timer. Subarray parallel refreshes take advantage of independent control architecture for subarrays within a bank. This allows subarrays within a bank to be accessed and/or refreshed independently. For example, when one of the subarrays within the bank is being accessed, the other subarrays may be refreshed concurrently. This may be referred to as a "hidden refresh." Various embodiments also ease scheduling and tracking requirements on memory controllers for refreshes performed on individual subarrays.

Further embodiments may implement PSSR in combination with the subarray parallel refresh operability.

Accordingly, with reference to FIGS. 1A, 1B, and 1C, the memory device 100A, 100B, 100C includes input/output pads 105, shared control logic 110, temperature sensor 115, refresh control circuit 120, address/control bus 125, memory bank 0 130A, bank 1 130B, bank 2 130C, bank 3 130D (collectively "banks 130"), bank control logic 135A-D (collectively 135), and memory arrays 145A-H (collectively 145). In FIGS. 1B and 1C, in addition to these elements, the memory device 100B may further include subarray refresh circuits 140A-H (collectively 140) for each memory array 145, respectively. In various embodiments, refresh control circuit 120 may be configured to generate a signal, "sref-tREFI" or alternatively labeled "sref_tREFI," periodically. In some embodiments, the refresh control circuit 120 may include refresh circuitry for generating refresh commands internally, without requiring input from an external memory controller. In further embodiments, the refresh control circuit 120 may be configured to execute externally generated refresh commands.

In various embodiments, the refresh control circuit 120 may also include a self-refresh timer that, after initialization, runs continuously. In some embodiments, the self-refresh timer may be provided outside of the refresh control circuit and coupled to the refresh control circuit 120. In various embodiments, the self-refresh timer may continue to operate while the bank control logic 135 performs other operations (e.g. an activation, a read operation and a write operation) on the bank 130. The self-refresh timer may then generate sref-tREFI each time a self-refresh refresh time interval elapses. In various embodiments, the self-refresh time interval may be an average minimum retention time for a particular memory device 100, while in self-refresh mode. That is, sref-tREFI indicates when a refresh should be performed if all refreshes were evenly spaced across each row of an individual bank, for a rank-level refresh. For example, in one embodiment, minimum retention time may be 64 ms/8192 rows, or approximate 7.8 µs. The average minimum retention time, however, is temperature dependent due to leakage within the cells. Typically, the higher the operating temperature, the shorter the minimum retention time, and vice versa, the lower the operating temperature, the longer the minimum retention time. Thus, in one set of embodiments, one example of the self-refresh refresh time interval may be range between 1.7 µs at temperatures above 106 C and 39.71 µs at temperatures below 26 C. Accordingly, in various embodiments, the self-refresh timer may generate sref-tREFI according to the self-refresh refresh time interval, based on temperature information received from the temperature sensor 115, and indicative of a temperature, on-die or ambient, sensed by the temperature sensor 115. In some embodiments, the self-refresh timer may be a timer, counter, clock, or any other suitable device for determining when a self-refresh refresh interval has elapsed. The self-refresh timer may further be independent of entry into or exit from self-refresh mode. For example, in some embodiments, initialization of the self-refresh timer may not depend on, or be based on, either entry into or exit from self-refresh mode. Furthermore, the self-refresh timer may be configured to be neither reset nor suspended upon entry into or exit from self-refresh mode. In various embodiments, the refresh control circuit 120 may further be communicatively coupled to address/control bus 125, such that the self-refresh timer may broadcast sref-tREFI to each bank control logic 135 via the address/control bus 125.

In various embodiments, a rank of memory device 100 may include four banks, Bank 0 130A, Bank 1 130B, Bank 2 130C, and Bank 3 130D. Each of the banks 130 may, themselves, comprise at least two subarrays. For example, Bank 0 130A may include two subarrays, memory array 145A and memory array 145B. Similarly, Bank 1 130B may include two subarrays, memory array 145C and memory array 145D. Bank 2 130C and Bank 3 130D may each similarly include two subarrays respectively. In various embodiments, each subarray pair of memory arrays 145, within the same bank 130, may share a common column select logic, while having individual row select logic. Each bank 130 may further include respective bank control logic 135. Each bank control logic 135 may, in turn, include subarray refresh circuits 140, referred to as "half bank refresh circuits" in some embodiments, for each memory array 145 of the bank 130, respectively. For example, Bank 0 130A may include a bank control logic 135A, the bank control logic having a subarray refresh circuit 140A in communication with memory array 145A, and a subarray refresh circuit 140B in communication with memory array 145B.

FIG. 1C illustrates an alternative architecture for the memory arrays 145, where the shared column select logic may be located at an edge of the memory arrays 145, and respective pairs of memory arrays 145 may be adjacent to each other. For example, in memory device 100C, the column select logic may be provided at the bottom edge of memory array 145B. Accordingly, memory array 145A and memory array 145B may be adjacent to each other. In some embodiments, as depicted, the memory arrays may further share a circuit, such as sense amplifier 155. Accordingly, a row 150 of memory array 145A may share sense amp 155 with adjacent row 160 of memory array 145B. This configuration may further be implemented in each of the banks 130.

According to various embodiments, each of the subarray refresh circuits 140 may include a respective refresh status counter. The subarray refresh circuits 140 may be configured to increment the refresh status counter each time the sref-tREFI signal is received, and decrement the refresh status counter each time a refresh operation is performed on a corresponding memory array 145. In some embodiments, the refresh status counter may be initialized with a starting value between a high threshold—corresponding to the maximum refresh debit allowable for the subarray, and a low threshold—corresponding to the maximum refresh credit allowed for the subarray. The size of the refresh status counter may be selected based on the difference between the desired maximum refresh credit and the maximum refresh debit. For example, in one set of embodiments, the refresh status counter may be a 5-bit counter, corresponding to a maximum debit of 8 refreshes and a maximum credit of 9 refreshes. In this example, the refresh status counter may be initialized to a starting value of 9, with the maximum refresh debit corresponding to a value of 17, and a maximum refresh credit corresponding to a value of 0.

Continuing with the previous example, each time an sref-tREFI signal is received from the self-refresh timer, the status may increment by 1 count. For example, after initialization, if no refreshes are made before sref-tREFI is received, the counter will increment from a value of 9 to a value of 10. Thus, the refresh status counter will track the number of refreshes each subarray (e.g. half bank) should have performed, as indicated by the number of times the self-refresh refresh time interval has elapsed. Correspondingly, each time a refresh operation is performed on the subarray, the refresh status counter will decrement until a low threshold is reached.

In further embodiments, each subarray refresh circuit 140 may be configured to perform hidden refreshes. That is, each time another subarray 145 on the same bank 130 is activated, the subarray refresh circuit 140 will perform a refresh on its respective subarray 145. For example, if subarray refresh circuit 140A is issued an activate command, thereby activating memory array 145A, the subarray refresh circuit 140B may perform a refresh on memory array 145B. Similarly, with roles reversed, if memory array 145B is activated, the subarray refresh circuit 140A may perform a refresh on memory array 145A. Each of the other banks 130B, 130C, 130D may be configured similarly to refresh and activate respective subarray pairs 145C-H concurrently via the respective subarray refresh circuits 140C-H. Accordingly, when a hidden refresh is performed, the refresh status counter for the activated subarray is not decremented, while the refresh status counter for the subarray that is given a hidden refresh is decremented. In this way, subarray parallel refresh operations may be supported and tracked by the respective subarray refresh circuits 140 instead of requiring an external memory controller to perform these operations. However, when a refresh status counter reaches the high threshold on any of the subarray refresh circuits 140, the respective subarray refresh circuit 140 may be configured to raise a refresh alert. In some embodiments, the refresh alert may be transmitted by the subarray refresh circuit 140 to a memory controller requesting a refresh command to be issued. In other embodiments, the refresh alert may be provided to the shared control logic 110 or refresh control circuit 120, requesting an internally generated refresh command. Conversely, when a refresh status counter reaches the low threshold, the subarray refresh circuit 140 may be configured to ignore refresh commands or hidden refreshes. For example, if the refresh status counter for subarray refresh circuit 140B has reached the low threshold, and subarray 145A has been activated, the subarray refresh circuit 140B may block a hidden refresh from being performed. Similarly, if a refresh command is supplied while the refresh status counter is at the low threshold, the subarray refresh circuit 140B may block the refresh command from being executed. The directions of change (e.g. incrementing and decrementing) of the refresh status counter are not limited to the example set forth above. Similarly, the thresholds (e.g. the high threshold and the low threshold) for triggering a refresh and blocking a refresh are not limited to the example set forth above. For example, one skilled in the art will recognize that the roles of high and low thresholds, as well as increment and decrement events, may be reversed without departing from the scope of the method.

In various embodiments, each subarray refresh circuit 140 may further include a respective refresh address counter. The refresh address counters may be configured to indicate a row address of a row within the subarray 145 to be refreshed. Accordingly, each time a refresh is performed on the subarray 145, the refresh address counter is incremented to the next row address needing to be refreshed. In various embodiments, the subarray refresh circuits 140 may further be configured to block refreshes from occurring in a respective subarray 145 when the row activated in another subarray 145 on the same bank 130 is within the section adjacent to the respective subarray 145. For example, in one embodiment, with reference to FIG. 1C, when row 160 of the memory array 145B is activated, concurrent refreshing of row 150 of memory array 145A may be blocked by subarray refresh circuit 140A. In further embodiments, if the row address in the refresh address counter is determined to be within an adjacent section, the subarray refresh circuit 140 may be configured to perform a refresh at a different row address without decrementing the refresh status counter. The subarray refresh circuit 140 may then refresh the row address at the refresh address counter on a subsequent hidden refresh or refresh command.

In yet further embodiments, the bank control logic 135 may be configured to operate in PSSR mode. In particular, embodiments of memory devices 100A, 100B, and 100C may be configured to operate in a PSSR mode. For example, in some embodiments, bank control logic 135 may be configured to set a refresh flag in response to receiving the sref-tREFI signal. Alternatively, in other embodiments, the refresh flag may be set, upon receiving sref-tREFI, at the subarray refresh circuits 140, or at the refresh control circuit 120. Upon entry into self-refresh mode, the bank control logic 140 may be configured to first determine whether the refresh flag has been set. If the refresh flag has been set, the bank control logic 135 may be configured to perform a refresh across the entire bank 130. However, if the refresh flag has not been set, the bank control logic 135 may be configured to wait until the next sref-tREFI signal from the self-refresh timer is received, thereby setting the refresh flag. Thus, sref-tREFI may be generated by the self-refresh timer independent of entry into or exit from self-refresh mode. In one set of embodiments, this may include the self-refresh timer not resetting upon entry or exit from self-refresh mode. In this way, sref-tREFI may be generated consistently, at each self-refresh refresh time interval, as measure from the previous time that sref-tREFI was issued. Thus, the self-refresh timer does not restart or assert sref-tREFI based on entering or exiting self-refresh mode.

Figure 2:
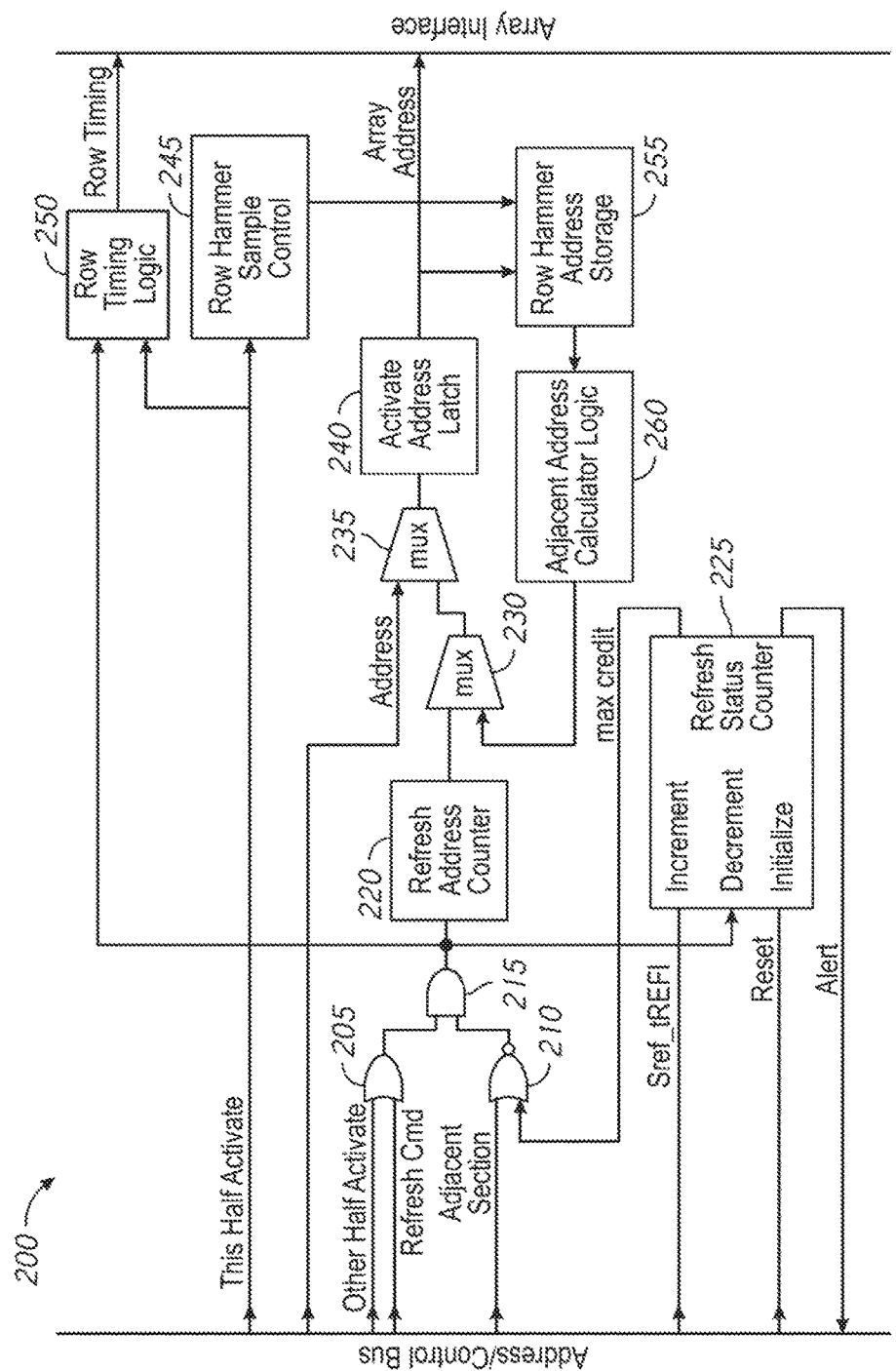
FIG. 2 is a schematic diagram of a refresh control circuit, in accordance with various embodiments.

Accordingly, in various embodiments, bank-level, or alternatively rank-level, self-refreshes are only performed when both the refresh flag is set and self-refresh mode has been entered. Upon the performance of a self-refresh, the bank control logic 135 may be configured to clear the refresh flag until the next sref-tREFI is received. In this manner, excess self-refreshing from repeated entry into and exit from self-refresh mode may be avoided. In some further embodiments, bank control logic 135 may be configured to execute multiple self-refreshes upon entry into self-refresh mode. In one set of embodiments, self-refreshes may be executed until all refresh status counters in each of the subarray refresh circuits 140 has reached a pre-determined count value. The pre-determined value, for example, may be the initialization value. In other embodiments, the pre-determined value may be the low threshold, or another value below the high threshold. 100301 FIG. 2 illustrates a schematic diagram of a subarray refresh circuit 200 according to various embodiments. As described above with reference to the subarray refresh circuits 140 in FIG. 1, subarray refresh circuit 200 may be configured to implement subarray parallel refresh operations, such as a hidden refresh, based on sref-tREFI. Accordingly, the subarray refresh circuit 200 includes a OR gate 205, NOR gate 210, AND gate 215, refresh address counter 220, refresh status counter 225, first multiplexer (mux) 230, second mux 235, activation address latch 240, sampling logic 245, row timing logic 250, row hammer address storage 255, and adjacent address calculator logic 260.

In operation, the first OR gate 205 may be configured to indicate if either a complementary subarray has been activated, or if a refresh command has been issued. For example, the OR gate 205 may receive a first input indicative of the activation of a complementary subarray, referred to here as an other half activate signal, and a second input indicative of a refresh command. Accordingly, if either a complementary subarray is active, or a refresh command is issued, the OR gate is configured to output true. The NOR gate 210 may be configured to block a refresh command if either an adjacent section in another subarray is being activated or if a low threshold of the refresh status counter 225 has been reached. Accordingly, if either inputs are true, the NOR gate 210 outputs a false. AND gate 215 receives outputs from both the OR gate 205 and NOR gate 210. The output of the AND gate 215 is then provided to the refresh address counter 220, the decrement pin of the refresh status counter 225, and as an input to row timing logic 250. Thus, if the output of the AND gate 215 is true, it causes a refresh status counter 225 to decrement corresponding to the refresh operation. Row timing logic 250 may be configured to provide appropriate row timings for executing a refresh command.

In various embodiments, the refresh address counter 220 may be configured to output a row address of the next row of the subarray to be refreshed. Accordingly, if the AND gate 215 provides a true output, the refresh address counter 220 may be configured to provide the row address to the first mux 230. In some embodiments, refresh address counter 220 may be configured to increment to a subsequent row address after a refresh operation has been performed, or alternatively, after providing the row address to mux 230. First mux 230 may be configured to select between a row address provided by the refresh address counter 220 and a row address provided by adjacent address calculator logic 260. Accordingly, if a row address is to be provided by the refresh address counter 220, the row address from refresh address counter 220 may be selected. If the next refresh cycle is scheduled as a row hammer repair (RHR) cycle, the row address from the adjacent address calculator logic 260 may be selected. Second mux 235 is configured to select between a row activation address when the subarray associated with the subarray refresh circuit 200 is issued an activate command, and the refresh row address provided by the first mux 230.

According to various embodiments, if an activate command is issued to the subarray associated with the subarray refresh circuit 200, the second multiplexer 235 may transmit the row activation address to the activation address latch 240, which then forwards the address to the appropriate row selection logic for the associated subarray. A control signal indicative of the activation of the associated subarray, referred to here as "this half activate," may also be asserted as part of the activate command. The row timing logic 250, may thus utilize "this half activate" to provide the correct row timings for executing the activate command. Sampling logic 245 may be configured to cause row hammer address storage 255 to store the row address at the activation address latch 240. For example, in some embodiments, the row hammer address storage 255 may itself be a latch. Adjacent address calculator logic 260 may then be configured to retrieve the stored row address from the row hammer address storage 255 to calculate the address of the adjacent row or rows to receive row hammer repair (RHR), and provide first mux 230 with an alternative row. The adjacent address calculator logic 260 may be configured to output a row address that is adjacent to a hammered row. Adjacent addresses may include, without limitation, row addresses adjacent to the row address in row hammer address storage 255, row addresses adjacent to the immediately adjacent row addresses, or a range of row addresses in proximity to the row address in row hammer storage 255. In some embodiments, when an adjacent row address from adjacent address calculator logic 260 is refreshed, it may be referred to as a refresh "steal." A refresh "steal" does not cause a decrement to the refresh status counter 225, and may allow the row address at refresh address counter 220 to be refreshed on a subsequent hidden refresh or refresh command.

Figure 3:
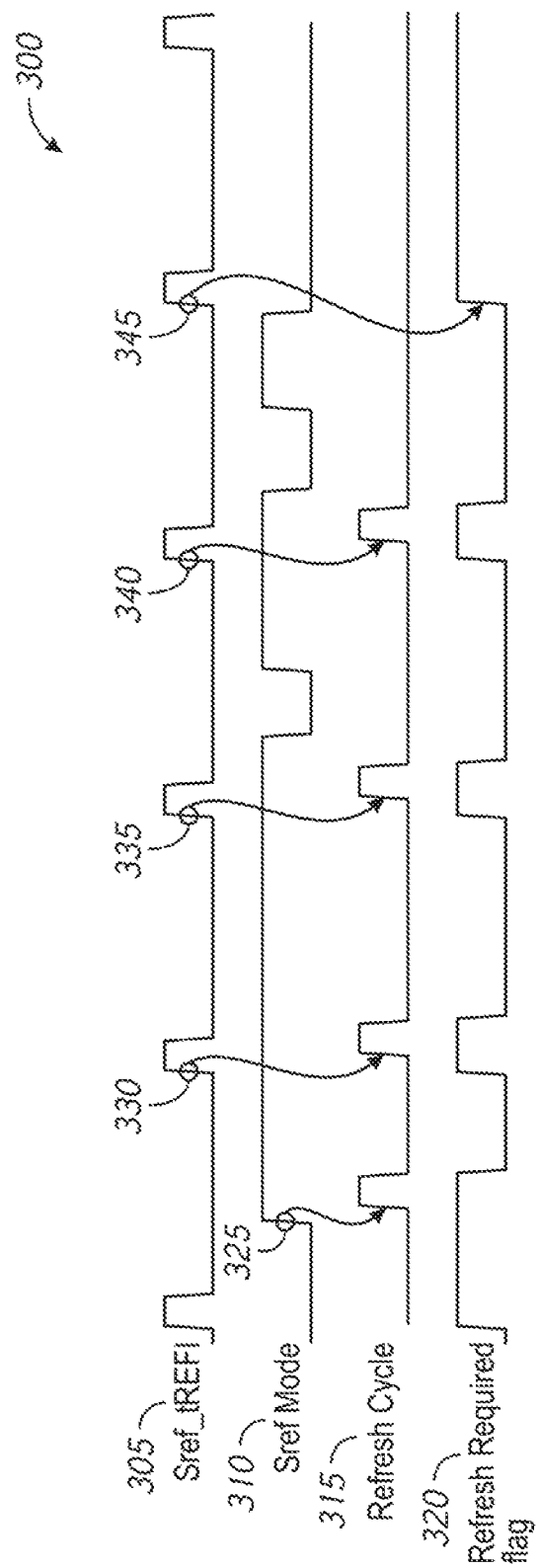
FIG. 3 is a timing diagram showing self-refresh operation, in accordance with various embodiments.

FIG. 3 illustrates a timing diagram 300 for PSSR operation, according to various embodiments. The timing diagram 300 includes sref-tREFI 305, sref mode 310, refresh cycle 315, and refresh flag 320. Sref-tREFI 305 depicts the sref-tREFI signal being asserted periodically at a self-refresh refresh time interval at rising edges 330, 335, 340, 345. Accordingly, in one example of PSSR operation, when sref-tREFI 305 is first asserted, the refresh flag 320 is raised. However, as depicted in sref mode 310 and refresh cycle 315, a refresh is not performed until self-refresh mode is entered at rising edge 325. Thus, rising edge 325 corresponds to the rising edge of refresh cycle 315, offset by some delay. Once the refresh is performed, the refresh flag is cleared, and returns low. At rising edge 330 of sref-tREFI 305, the refresh flag 320 is raised. Because self-refresh mode 310 is still active when the refresh flag 320 is set, refresh cycle 315 shows that a refresh is performed immediately with the refresh flag 320. When the refresh cycle is complete, the refresh flag is once again cleared. Sref mode 310 then shows that self-refresh mode is exited, then re-entered, between sref-tREFI cycles. Again, because no refresh flag was set, mere exit and re-entry into self-refresh mode does not trigger a refresh. Instead, as shown at rising edge 340, refresh is only performed when both in self-refresh mode and the refresh flag is set. Continuing with this example, at rising edge 345, when sref-tREFI 305 is asserted after self-refresh mode has been exited, the refresh flag 320 is set, but no refresh performed until self-refresh mode is entered into again. Accordingly, by utilizing a continuous self-refresh timer to generate sref-tREFI, memory may repeatedly enter and exit self-refresh mode, multiple times per sref-tREFI interval, without performing a refresh operation each time self-refresh mode is re-entered.

Figure 4:
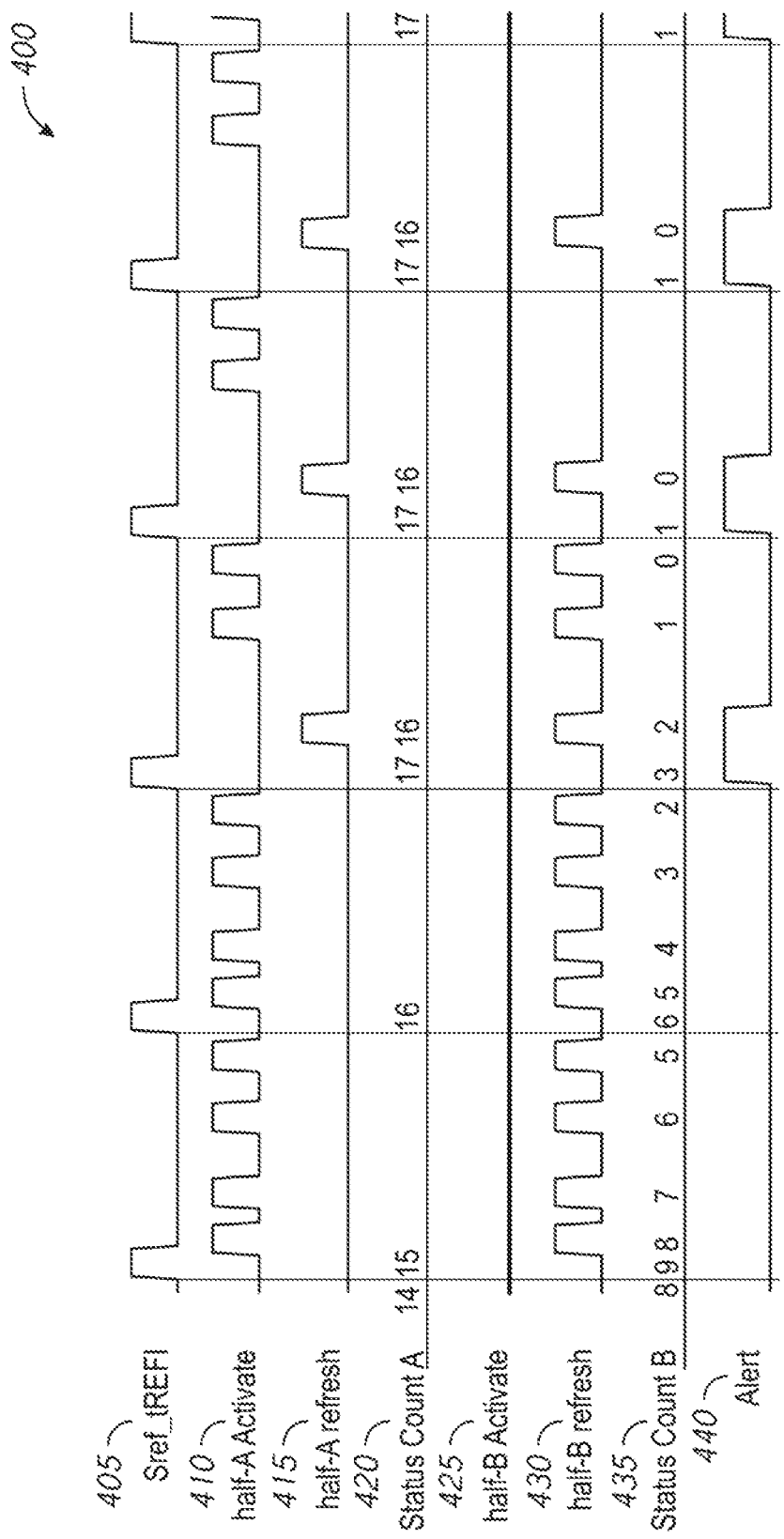
FIG. 4 is a timing diagram showing subarray parallel refresh operation, in accordance with various embodiments.

FIG. 4 is a timing diagram 400 showing an example of subarray parallel refresh operation according to various embodiments. The example timing diagram 400 includes a sref-tREFI 405, half-A activate 410, half-A refresh 415, refresh status count A 420, half-B activate 425, half-B refresh 430, refresh status count B 435, and refresh alert 440. Sref-tREFI 405 illustrates the sref-tREFI signal, as periodically raised at a self-refresh refresh time interval. Half-A activate 410 is indicative of the activation of subarray half-A over time. Half-A refresh 415 depicts refreshes of subarray half-A over time. Refresh status count A 420 shows the count value of a refresh status counter for subarray half-A. Correspondingly, half-B activate 425 illustrates activation of subarray half-B, and half-B refresh 430 illustrates refreshes performed on subarray half-B. Refresh status count B 435 shows the count value of a refresh status counter for subarray half-B, and refresh alert 440 depicts whether an alert has been raised based on a refresh status count exceeding a high threshold. In various embodiments, subarray half-A may belong to the same bank as subarray half-B, thus being complementary subarrays.

As depicted in the example, subarray half-A is repeatedly activated for the first two sref-tREFI intervals, a total of 8 times, without being refreshed. Sref-tREFI 405 has been asserted twice during that interval. Refresh status count A 420 may have started at a value of 14, indicating a refresh debit of five refreshes. At each sref-tREFI 405 the refresh status counter A 420 is incremented. Thus, refresh status count A 425 has a value of 16 at the end of the second sref-tREFI interval. During this same time interval, subarray half-B has not been activated, as shown by half-B activate 425. Instead, as shown in half-B refresh 430, subarray half-B is refreshed in parallel with the half-A activate 410, via hidden refresh. Accordingly, refresh status count B 435, which had a starting value of 8, may be incremented by the first sref-tREFI 405, but decrements by 1 for each hidden refresh. The second sref-tREFI 405 increments the refresh status count B 435 to 6, but is again decremented by 1 for each hidden refresh, ending with a value of two at the end of the second sref-tREFI interval. The third sref-tREFI 405 may increment refresh status count A 420 to a high threshold corresponding, in this example, to a value of 17. Accordingly, a refresh alert 440 may be raised, and a refresh command requested from the memory controller. Once the refresh command is received, a refresh may be performed globally across the entire bank, as shown in both half-A refresh 415 and half-B refresh 430. Thus, when subarray half-A refreshes, the refresh status count A is decremented from a value of 17 to a value of 16. Similarly, refresh status count B 435 is decremented from a value of 3 to a value of 2. At the end of the third sref-tREFI interval, subarray half-A is activated two more times, causing two hidden refreshes of subarray half-B. Refresh status count B 435 is then decremented from a value of 2 to a low threshold corresponding, in this example, to a value of 0 at the end of the third sref-tREFI interval. The fourth sref-tREFI 405 against causes a refresh alert 440 to be raised, and another refresh command to be issued. Refresh status count B 435, although being at the low threshold, is incremented by the fourth sref-tREFI 405, allowing subarray half-B to be refreshed again, by the refresh command, which then returns the refresh status count B to 0. Towards the end of the fourth sref-tREFI interval, subarray half-A is again activated twice. This time, because refresh status count B 435 is at the low threshold, no hidden refreshes are performed on subarray half-B. This pattern is then repeated for the fifth sref-tREFI 405, over a fifth sref-tREFI interval, with one refresh executed on both subarrays half-A and half-B, corresponding to the refresh alert 440, and subsequent hidden refreshes of subarray half-B being blocked.

It is to be understood that the above examples provided in FIGS. 3 & 4 are simplified timing diagrams to aid in the conceptual understanding of PSSR and subarray parallel refresh operation. Therefore, the embodiments illustrated in FIGS. 3 & 4 should not be taken as limiting in any way.

Figure 5B:
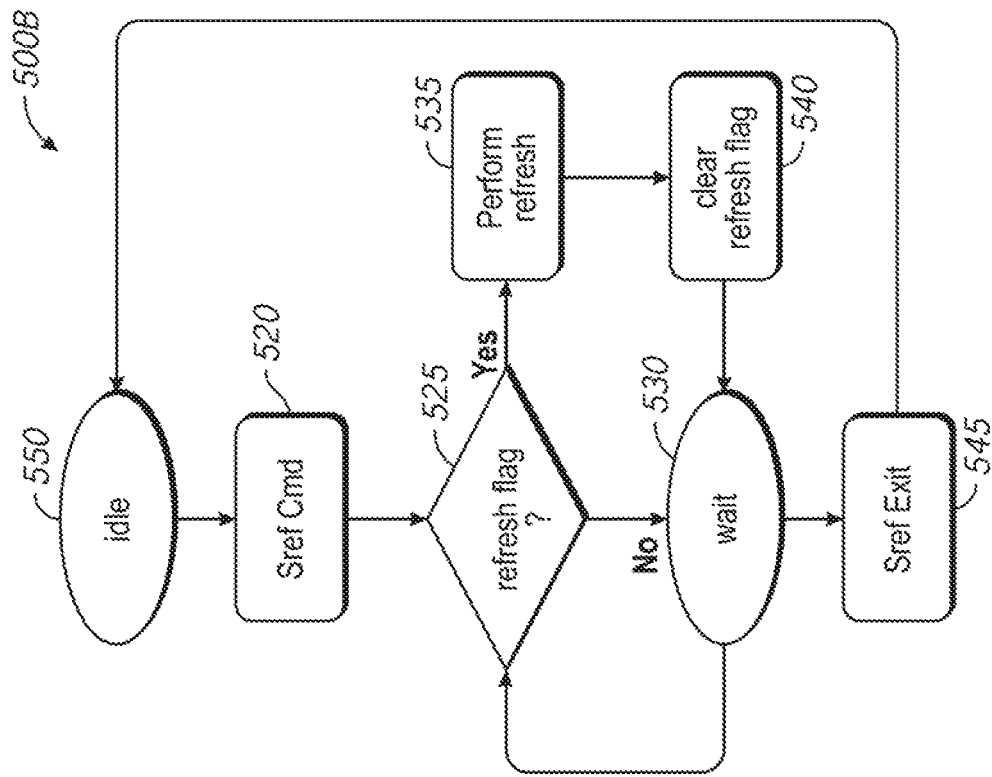
FIG. 5B is a flow diagram of a process for self-refresh of a memory device, in accordance with various embodiments.
Figure 5A:
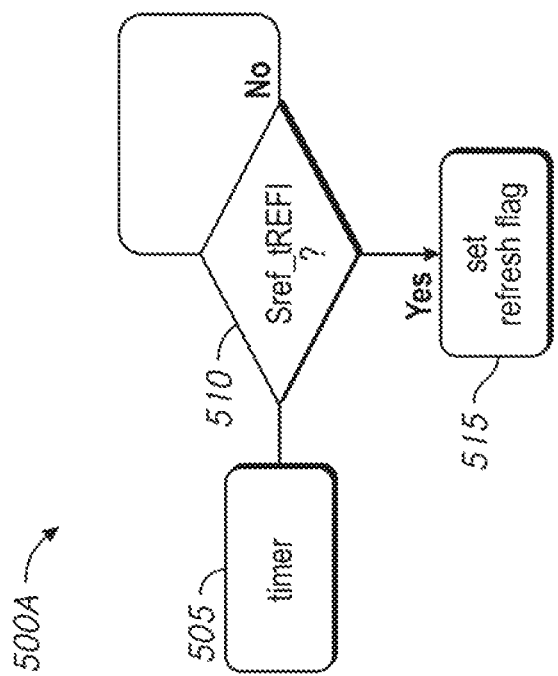
FIG. 5A is a flow diagram of a process for setting a refresh flag based on a self-refresh refresh time interval, in accordance with various embodiments.

FIGS. 5A & 5B are flow diagrams of a process for PSSR operation, according to various embodiments. FIG. 5A illustrates a method 500A of operating a self-refresh timer, in accordance with various embodiments. The method 500A begins, at block 505, by generating timer data. As discussed with respect to the previous embodiments, the self-refresh timer may generate timer data continuously, upon initialization, and independent of entry into or exit from self-refresh mode. The method 500A may continue, at decision block 510, by determining, via the self-refresh timer, whether a self-refresh refresh time interval has elapsed and sref-tREFI has been asserted. As described with respect to the embodiments above, the self-refresh time interval may correspond to an average minimum retention time for the memory device, at a given temperature, while in self-refresh mode. If, a self-refresh refresh time interval has elapsed, the self-refresh timer may assert the sref-tREFI signal. If sref-tREFI has been asserted, at block 515, a refresh flag may be set. If sref-tREFI has not yet been asserted, the self-refresh timer may continue wait until the self-refresh refresh time interval has elapsed before issuing sref-tREFI. In various embodiments, the refresh flag may be set by the self-refresh timer or in various refresh control circuits. For example, in some embodiments, the refresh flag may be set at a refresh control circuit at a rank-level, bank-level, or subarray-level. Accordingly, with reference to FIGS. 1A & 1B, the refresh control circuit may be part of any of the internal, shared refresh control circuit 120 for one or more banks, bank control logic 135 for individual banks, or in subarray refresh circuits 140.

FIG. 5B illustrates a method 500B for PSSR operation, according to various embodiments. The method 500B begins, at block 550, at an idle state until, at block 520, a self-refresh mode command is received. When the self-refresh mode command is received, a refresh control circuit, such as, without limitation, the subarray refresh circuit, bank control logic, or a shared internal refresh control circuit may enter into self-refresh mode. Accordingly, in various embodiments, the refresh control circuit may be a refresh control circuit at any of a rank level, bank level, or a subarray level. Then, at decision block 525, the refresh control circuit determines whether the refresh flag has been set. If the refresh flag has not been set, at block 530, the refresh control circuit may wait until the refresh flag is set. Otherwise, at block 545, when a self-refresh exit command is received, the refresh control circuit may exit from self-refresh mode and return to an idle state, at block 550. If, at decision block 525, a refresh flag has been set, a refresh is performed, at block 535, via the refresh control circuit. After the refresh has been performed, at block 540, the refresh flag is cleared and the refresh control circuit enters a waiting state, at block 530.

FIGS. 6A & 6B are flow diagrams of a subarray parallel refresh operation. FIG. 6A is a flow diagram of a method 600A of operating a self-refresh timer, in accordance with various embodiments. As in FIG. 5A, the method 600A begins, at block 605, by generating timer data. The self-refresh timer may generate timer data continuously, after initialization, and independent of entry into or exit from self-refresh mode. The method 600A may continue, at decision block 610, by determining, via the self-refresh timer, whether a self-refresh refresh time interval has elapsed and sref-tREFI has been asserted. If, a self-refresh refresh time interval has elapsed, the self-refresh timer may assert the sref-tREFI signal. If sref-tREFI has been asserted, at block 615, a the refresh status counter may be incremented. If sref-tREFI has not yet been asserted, the self-refresh timer may continue wait until the self-refresh refresh time interval has elapsed before issuing sref-tREFI.

FIG. 6B illustrates a method 600B for subarray parallel refresh of a memory device, in accordance with various embodiments. The method begins, at decision block 620, by determining whether any refresh status counters for any of the subarrays reaches a high threshold. In the illustrated embodiments, the high threshold may correspond to a counter value of 17, or a refresh status count that exceeds 16. In other examples, as described above, other values may be established for the high threshold, as well as a low threshold and an initialization value. In various embodiments, individual subarray refresh circuits, respectively associated with each subarray, may make their respective determinations.

If the high threshold has been reached by any of the subarray refresh circuits, at block 625, a refresh alert may be raised to a memory controller, requesting that a refresh command be issued. In some embodiments, the refresh command may be a global refresh command across one or more ranks, a per-bank refresh command, or a refresh command for a subset of banks in one or more ranks. If no refresh status count reaches the high threshold, the subarray refresh circuits may enter into an idle state, at block 630.

At block 635, an activate command may be received for subarray half-A. In various embodiments, a bank may include one or more subarrays, including subarrays half-A and half-B. In response to receiving the activate command, the subarray refresh circuit for subarray half-A may activate subarray half-A. At decision block 640, the subarray refresh circuit for subarray half-B may determine whether the refresh status count for subarray half-B has reached the low threshold. In this case, the low threshold may correspond to a value of 0. If the refresh status count for the subarray half-B has reached the low threshold, no hidden refresh is performed, and resumes, at decision block 620, to determine whether any refresh status counts have exceeded the high threshold. However, if the refresh status count for subarray half-B has not reached the low threshold, at block 645, a hidden refresh of subarray half-B may be performed concurrently with the activation of subarray half-A. Once the hidden refresh has been performed, at block 650, the refresh status count for subarray half-B may be decremented, at the refresh status counter for subarray half-B, and the subarray refresh circuits return to an idle state, at block 630, if no refresh status counters for any subarrays have reached the high threshold.

At block 655, an activate command may be received for subarray half-B. In response to receiving the activate command, the subarray refresh circuit for subarray half-B may activate subarray half-B. At decision block 660, the subarray refresh circuit for subarray half-A may determine whether the refresh status count for subarray half-A has reached the low threshold, in this case 0. If the refresh status count for subarray half-A is at the low threshold, no hidden refresh may be performed, and proceeds, at decision block 620, to check whether any other refresh status counts have exceeded the high threshold. However, if the refresh status count for subarray half-A has not reached the low threshold, at block 670, a hidden refresh of subarray half-A may be performed concurrently with the activation of subarray half-B. Once the hidden refresh has been performed, at block 675, the refresh status count for subarray half-A may be decremented, via the refresh status counter for subarray half-A, and the subarray refresh circuits may return to an idle state, at block 630, if no refresh status counters for any subarrays have reached the high threshold.

At block 685, a refresh command may be received from a memory controller. Upon receiving the refresh command, the respective subarray refresh circuits may determine whether the respective refresh status counts for subarrays half-A and half-B are at a low threshold. As before, if the refresh status counts for the subarrays are above the low threshold, refreshes of the respective subarrays may be performed. If the refresh status counts are at the low threshold, the refresh command may be ignored.

Figure 7:
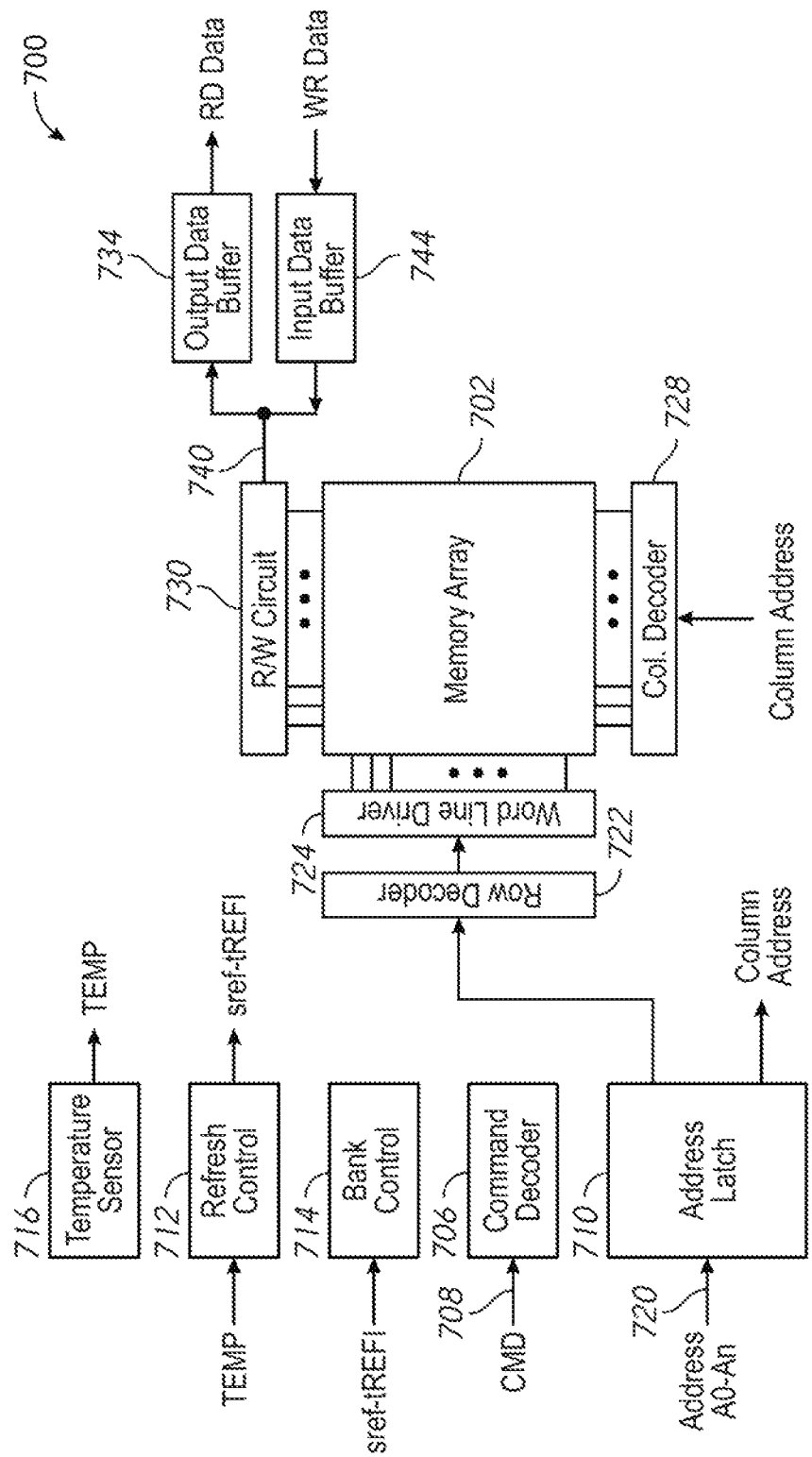
FIG. 7 is a block diagram of a memory system, in accordance with various embodiments.

FIG. 7 is a block diagram of a portion of a memory system 700, in accordance with various embodiments. The system 700 includes an array 702 of memory cells, which may be, for example, volatile memory cells (e.g., dynamic random-access memory (DRAM) memory cells, low-power DRAM memory (LPDRAM), static random-access memory (SRAM) memory cells), non-volatile memory cells (e.g., flash memory cells), or other types of memory cells. The memory 700 includes a command decoder 706 that may receive memory commands through a command bus 708 and provide (e.g., generate) corresponding control signals within the memory 700 to carry out various memory operations. For example, the command decoder 706 may respond to memory commands provided to the command bus 708 to perform various operations on the memory array 702. In particular, the command decoder 706 may be used to provide internal control signals to read data from and write data to the memory array 702. Row and column address signals may be provided (e.g., applied) to an address latch 710 in the memory 700 through an address bus 720. The address latch 710 may then provide (e.g., output) a separate column address and a separate row address.

The address latch 710 may provide row and column addresses to a row address decoder 722 and a column address decoder 728, respectively. The column address decoder 728 may select bit lines extending through the array 702 corresponding to respective column addresses. The row address decoder 722 may be connected to a word line driver 724 that activates respective rows of memory cells in the array 702 corresponding to the received row addresses. The selected data line (e.g., a bit line or bit lines) corresponding to a received column address may be coupled to a read/write circuitry 730 to provide read data to an output data buffer 734 via an input-output data path 740. Write data may be provided to the memory array 702 through an input data buffer 744 and the memory array read/write circuitry 730.

Temperature sensor 716 may be an on-die temperature sensor configured to measure a temperature, and provide temperature information, TEMP, for example, to other circuits of the memory 700, such as refresh control logic 712. In various embodiments, refresh control logic 712 includes a self-refresh timer as described in the above embodiments. The self-refresh timer may run continuously after initialization, and independently of entry into or exit from self-refresh mode. The self-refresh timer may further be configured to generate sref-tREFI periodically, each time a self-refresh refresh time interval elapses. Memory 700 may further include bank control circuits 714. Bank control circuits 714 may include subarray refresh circuits for individual subarrays of each bank. The bank control circuits 714 and refresh control logic 712, may be configured to provide both PSSR and subarray parallel refresh capabilities, in accordance with the previously described embodiments.

While certain features and aspects have been described with respect to exemplary embodiments, one skilled in the art will recognize that various modifications and additions can be made to the embodiments discussed without departing from the scope of the invention. Although the embodiments described above refer to particular features, the scope of this invention also includes embodiments having different combination of features and embodiments that do not include all of the above described features. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, various procedures may be reordered, added, and/or omitted in accordance with various embodiments. The procedures described with respect to one method or process may be incorporated within other described methods or processes; likewise, hardware components described according to a particular structural architecture and/or with respect to one system may be organized in alternative structural architectures and/or incorporated within other described systems. Hence, while various embodiments are described with or without certain features for ease of description, the various components and/or features described herein with respect to a particular embodiment can be combined, substituted, added, and/or subtracted from among other described embodiments. Consequently, although several exemplary embodiments are described above, it will be appreciated that the invention is intended to cover all modifications and equivalents within the scope of the following claims.

What is claimed is:

1. An apparatus comprising:
a self-refresh timer configured to generate a refresh signal periodically, wherein the self-refresh timer, after initialization, runs continuously;
a memory bank; and
a controller coupled to the self-refresh timer and configured to receive the refresh signal from the self-refresh timer and refresh the memory bank responsive, at least in part, to generation of the refresh signal when the apparatus is in a self-refresh mode, wherein the self-refresh timer is further configured to generate the refresh signal periodically while the apparatus is in a first operation mode different from the self-refresh mode, wherein the controller is further configured to set a flag responsive, at least in part, to generations of the refresh signal while the apparatus is in the first operation mode, and wherein the controller is further configured to determine whether the flag is set or not when the apparatus enters the self-refresh mode, to perform the refresh operation on the memory bank when the apparatus enters the self-refresh mode if the flag has been set, and to be prevented from performing the refresh operation on the memory bank when the apparatus enters the self-refresh mode if the flag has not been set.

2. The apparatus of claim 1, wherein the first operation mode includes at least one of read and write operation.

3. The apparatus of claim 1, wherein the memory bank comprises first and second memory arrays that are configured to be refreshed independently of each other, and the apparatus further comprises:
first and second array control circuits coupled respectively to the first and second memory arrays, and wherein each of the first and second array control circuits comprises a refresh status counter that is configured to change a count value thereof in a first direction responsive to the refresh signal and change the count value thereof in a second direction responsive to performing the refresh operation on a respective memory array.

4. The apparatus of claim 3, wherein each of the first and second memory array control circuits is further configured to provide an alert signal responsive, at least in part, to the count value of the status counter thereof reaching a first threshold value.

5. The apparatus of claim 3, wherein each of the first and second memory array control circuits is further configured to prevent the respective memory array from being refreshed when the count value of the refresh status counter thereof reaches a second threshold value.

6. The apparatus of claim 3, wherein one of the first and second array control circuits is configured to perform the refresh operation on the respective memory array when the other of the first and second array control circuits activates the respective memory array.

7. The apparatus of claim 3, wherein each of the first and second memory array control circuits further comprises an address counter that is configured to provide an address designating cells in the respective array to be refreshed.

* * * * *